(12) United States Patent
Davis

(10) Patent No.: US 9,345,178 B2
(45) Date of Patent: May 17, 2016

(54) CONFIGURABLE SHIELD FOR HAND-HELD ELECTRONIC DEVICE

(71) Applicant: Paul Fitzgerald Davis, San Jose, CA (US)

(72) Inventor: Paul Fitzgerald Davis, San Jose, CA (US)

(73) Assignee: Paul Fitzgerald Davis, San Jose, CA (US)

( * ) Notice: Subject to any disclaimer, the term of this patent is extended or adjusted under 35 U.S.C. 154(b) by 0 days.

(21) Appl. No.: 13/747,034

(22) Filed: Jan. 22, 2013

(65) Prior Publication Data

US 2013/0206470 A1      Aug. 15, 2013

Related U.S. Application Data

(60) Provisional application No. 61/736,385, filed on Dec. 12, 2012, provisional application No. 61/589,154, filed on Jan. 20, 2012.

(51) Int. Cl.

| *H05K 9/00* | (2006.01) |
|---|---|
| *H01R 27/02* | (2006.01) |
| *H01R 13/72* | (2006.01) |
| *H01R 31/06* | (2006.01) |
| *H04B 1/3888* | (2015.01) |

(52) U.S. Cl.
CPC .............. *H05K 9/0007* (2013.01); *H01R 13/72* (2013.01); *H01R 27/02* (2013.01); *H01R 31/06* (2013.01); *H04B 1/3888* (2013.01); *H05K 9/0043* (2013.01); *H05K 9/0045* (2013.01)

(58) Field of Classification Search
CPC ........................... H05K 9/0043; H05K 9/0045
USPC .................................. 174/382, 384; 361/818
See application file for complete search history.

(56) References Cited

U.S. PATENT DOCUMENTS

| 5,336,896 | A  | * | 8/1994 | Katz ........................... 250/515.1 |
|---|---|---|---|---|
| 7,075,798 | B2 | * | 7/2006 | Hendrickson ........ H05K 9/0043 206/720 |
| 7,176,387 | B1 | * | 2/2007 | Huang ........................... 174/393 |
| 8,270,929 | B1 | * | 9/2012 | Koeppel ............... H04B 1/3838 343/841 |

(Continued)

OTHER PUBLICATIONS

German, K., "A cell phone case for reducing cell phone radiation", CNET.com website, Sep. 16, 2011, available at http://www.cnet.com/8301-17918_1-20105781-85/a-cell-phone-case-for-reducing-cell-phone-radiation/, 6 pages.

(Continued)

*Primary Examiner* — Hung V Ngo
(74) *Attorney, Agent, or Firm* — Kilpatrick Townsend & Stockton LLP

(57) ABSTRACT

A shield for a portable electronic device includes a pouch with an opening sized to accommodate the portable device and a flap. The pouch includes shielding material inside the pouch and on the flap. When the flap is closed, the shielding material inside the pouch and the shielding material on the flap together substantially surround the device, thereby substantially preventing RF signals emitted by the device from leaving the shield, and further substantially preventing RF signals impinging on the shield from outside from reaching the device. When the flap is open, the shielding material inside the pouch and the shielding material on the flap leave a gap, thereby allowing RF signals emitted by the device to leave the shield, and further allowing RF signals impinging on the shield from outside to reach the device. The shield further includes a compartment for a charger and one or more power cord adapters.

17 Claims, 12 Drawing Sheets

(56) References Cited

U.S. PATENT DOCUMENTS

| | | | |
|---|---|---|---|
| 8,723,053 B2* | 5/2014 | Winch | H05K 9/0043 174/359 |
| 2004/0198264 A1 | 10/2004 | Saur et al. | |
| 2007/0259704 A1* | 11/2007 | Jung | H04B 1/3838 455/575.8 |
| 2008/0212303 A1* | 9/2008 | Farnworth | H05K 9/0043 361/816 |
| 2008/0311965 A1 | 12/2008 | Gao et al. | |
| 2010/0240421 A1 | 9/2010 | Sekora et al. | |
| 2012/0073873 A1* | 3/2012 | Nash | H05K 9/0047 174/382 |
| 2012/0285737 A1* | 11/2012 | Judy et al. | 174/381 |

OTHER PUBLICATIONS

Osun Technologies LLC, Osun Cell-Shield Technical Details specification sheet, no publication date, but PDF metadata signifies that the document was created Apr. 17, 2010, available at http://www.osuntech.com/Cell_Shield_Technical_Details.pdf, 1 page.

Osun Technologies LLC, Osun Cell-Shield Description brochure, no publication date, but PDF metadata signifies that the document was created Oct. 9, 2010, available at http://www.osuntech.com/Cell-Shield_description.pdf, 1 page.

* cited by examiner

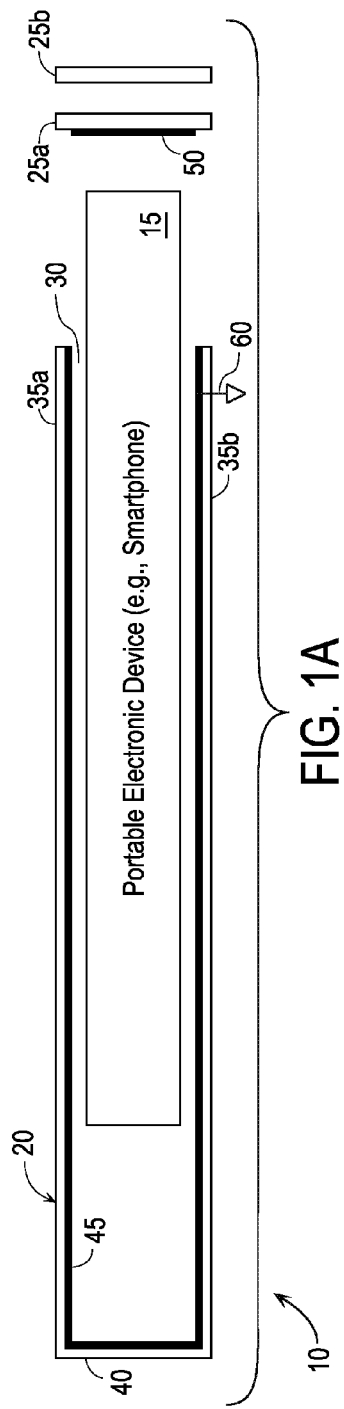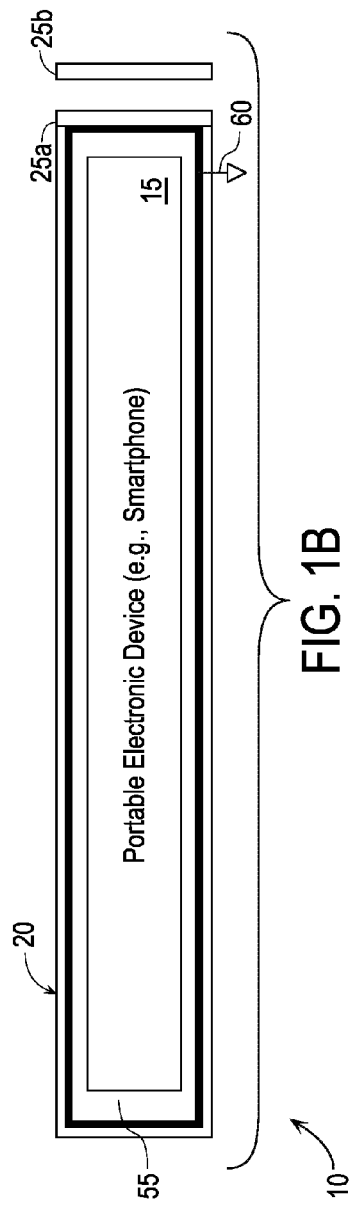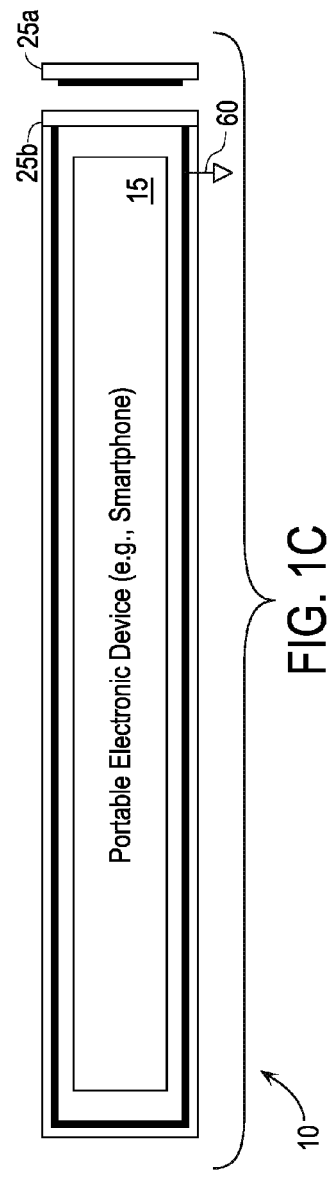

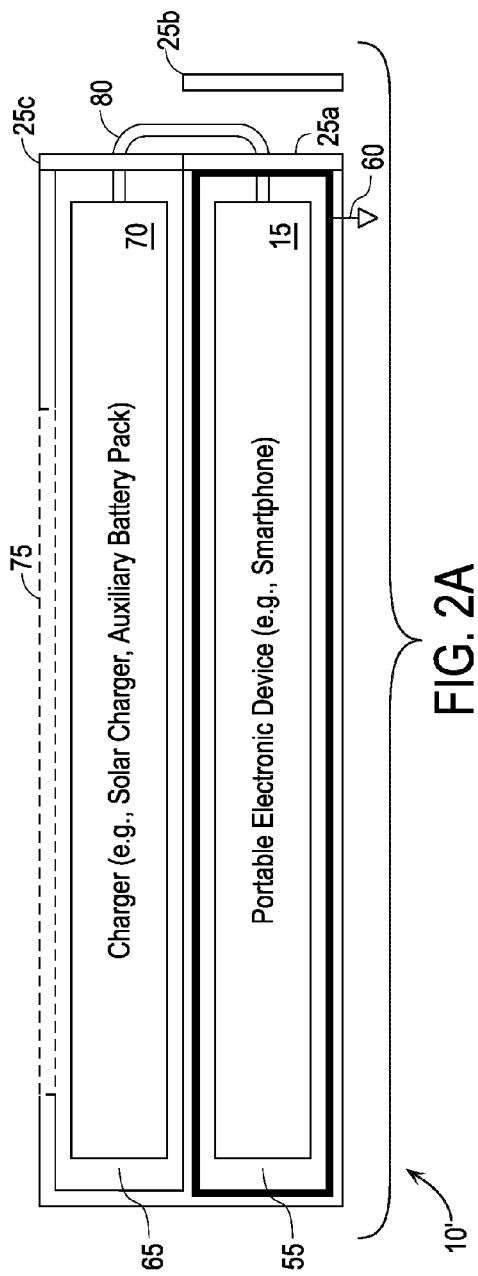
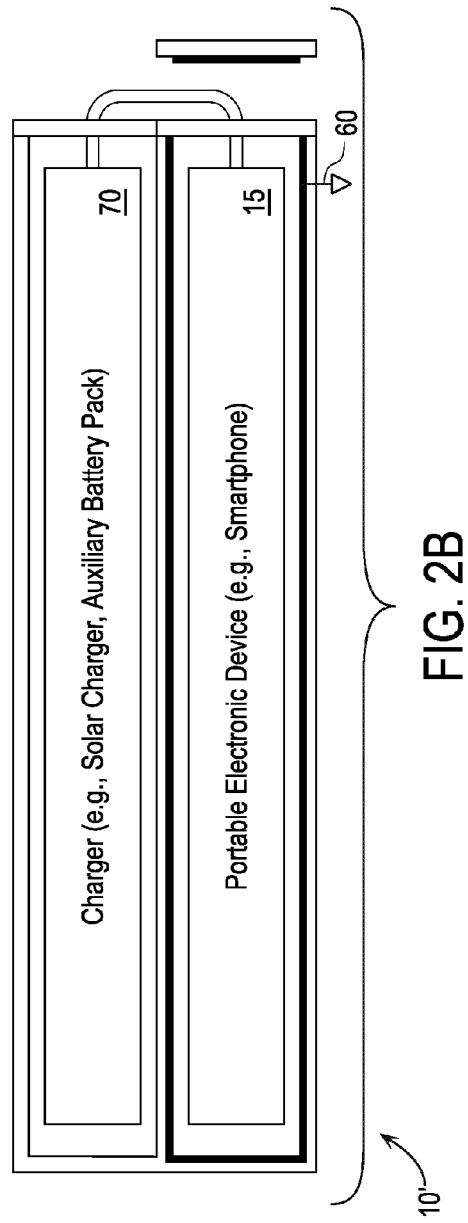
FIG. 2A
FIG. 2B

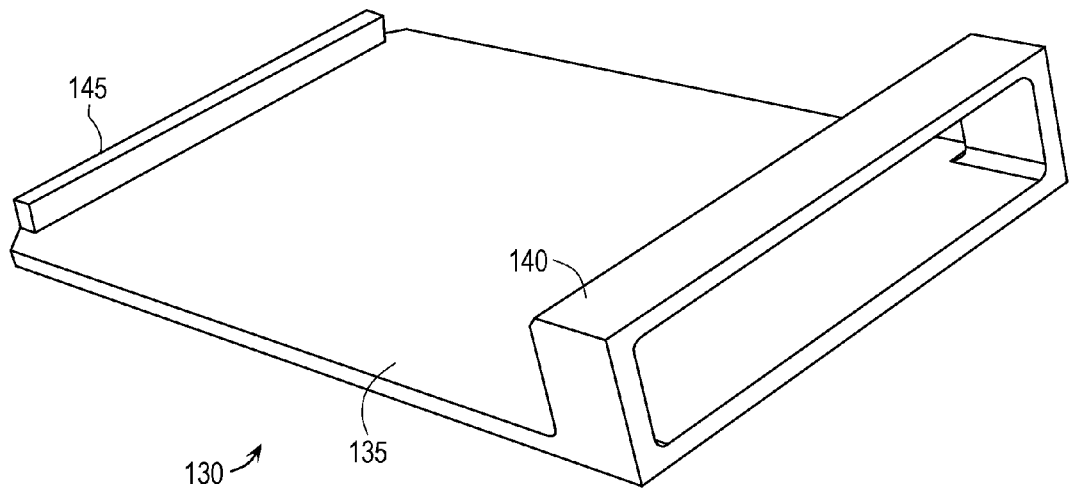
FIG. 5A
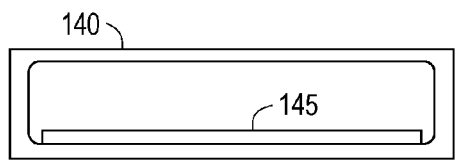　　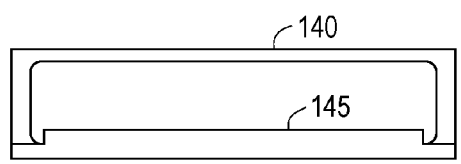
FIG. 5B　　FIG. 5C
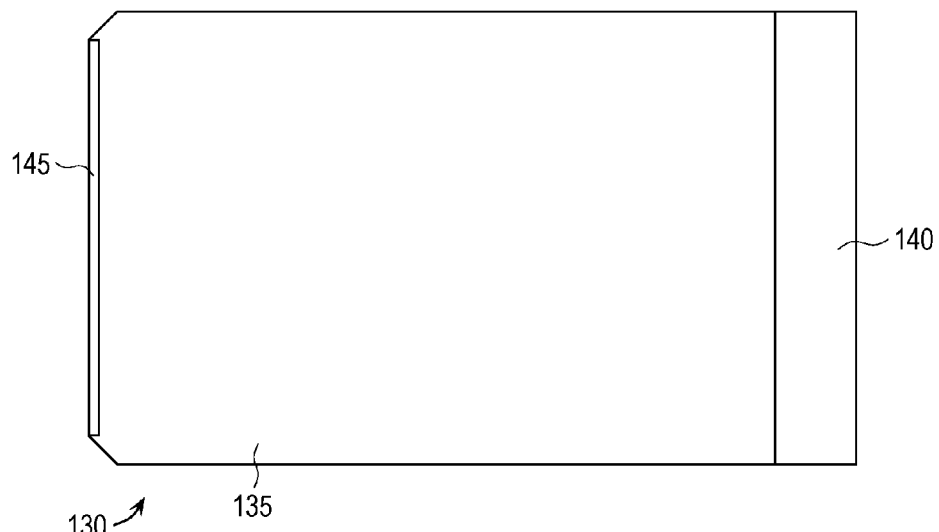
FIG. 5D

CONFIGURABLE SHIELD FOR HAND-HELD ELECTRONIC DEVICE

CROSS-REFERENCE TO RELATED APPLICATIONS

This application claims priority to, and incorporates by reference for all purposes the entire disclosures of, the following U.S. provisional applications:

U.S. Patent Application No. 61/736,385, filed Dec. 12, 2012, for "Radiation-Blocking Case for Hand-Held Electronic Device" (inventor Paul F. Davis); and U.S. patent application No. 61/589,154, filed Jan. 20, 2012, for "Leather Cell Phone Case/RF Signal Blocking Device/Electromagnetic Radiation Shielding Device" (titled in the original cover sheet as "The Wisephone case, is for enclosing a cell phone. It blocks RF signals to and from the device and blocks all electromagnetic radiation that may emanate from the cell phone. Made of a leather exterior; belt clip; an mid-lining of aluminized polyurethane; an inner bag of plus fabric; a Solar Cell phone charger; five different power adapters, that snap onto a plastic form mold. It has an opening at the top end, a back flap that folds down to seal the RF barrier" (inventor Paul F. Davis).

BACKGROUND AND SUMMARY OF THE INVENTION

The present invention relates generally to portable electronic devices such as smartphones or other cell phones, and more specifically to cases for controlling the amount of RF signal reaching or leaving such devices.

The recent proliferation of smartphone technology and supporting applications has increased their functionality and usefulness. This has spawned an uncharted frontier of opportunities such as applications, accessories, and social networking Smartphones are rapidly becoming an indispensable electronic appendage in everyday life in most societies globally.

Recent scientific studies have concluded that radiation associated with cell phones is potentially carcinogenic. Other scientific research by the World Health Organization has shown that cell phones emit high levels of electromagnetic radiation when the device is searching for a cell tower or when in an area with a weak signal. Findings in the same research recommend that users not carry cell phones in their pockets.

Radiation exposure is often quantified by the specific absorption rate ("SAR"), which is a measure of the rate at which energy is absorbed by the body when exposed to a radio frequency (RF) electromagnetic field (frequencies between 100 kHz and 10 GHz). The U.S. Federal Communications Commission ("FCC") specifies that phones have a SAR level at or below 1.6 watts per kilogram (W/kg) taken over a volume containing a mass of 1 gram of tissue. Other jurisdictions have similar requirements.

Inherent with this technological boom in cell phones and related apps are the issues of both end user and network security. Those with malicious intent are rapidly finding more and more ways to circumvent existing security measures and exploit system vulnerabilities. There exist malware apps that can, for example, expose critical confidential information and make it available to unauthorized entities, and it is easy and all-to-common for users to inadvertently end up with this malware installed on their smartphones.

Another issue is location privacy; even when a cell phone has its GPS feature disabled, that phone is still being tracked as it transmits from cell tower to cell tower in transit. This happens whether the cell phone owner wants it to or not. While some see this as part of the trade-off for advanced technology, others want to decide whether or not to have their phone tracked.

Separate from privacy and security considerations is the issue of distracted driving. For example, the California Highway Patrol statistics show a year-by-year increase in the number of citations issued for driving while using a cell phone without the aid of a hands-free device. Equally on the rise are the numbers of fatal car accidents and injury accidents due to drivers being distracted by using a cell phone or texting.

In short, embodiments of the present invention provide a shield having a compartment sized and configured to receive a portable electronic device (or simply "portable device" or "device" where clear from the context) that can be configured by the user to operate in either a blocking mode or a normal-use mode. This is effected by providing relatively movable elements of the shield with shielding material. By engaging and disengaging the shield elements, the portions of shielding material on the shield elements are engaged and disengaged.

In the blocking mode, elements of the shield are engaged so that the shielding material surrounds the device and prevents a significant portion of RF signals emitted by the device from leaving the shield, and further prevents a significant portion of RF signals impinging on the shield from outside from reaching the device. In the normal-use mode, elements of the shield are disengaged so the RF signals can enter and leave the shield.

The term "shielding material" as used in this application is intended to mean material whose composition and or dimensions cause it to prevent a significant portion of RF signals incident thereon from penetrating the material. While the ideal would be 100%, in this context, a "significant portion" is intended to mean at least 75%, preferably at least 85%, and most preferably at least 95%. The shielding material will typically be an electrically conductive material, but certain plastics such as ultra-high-molecular-weight ("UHMW") plastics can be used in some applications. The UHMW material can be filled with conductive material such as carbon, but need not assuming it is sufficiently thick. Such a plastic material could be used instead of, or in conjunction with, conductive materials.

The term "RF signal" as used in this application is intended to mean electromagnetic signals in the frequency range(s) commonly used by portable electronic devices for communication. Typical mobile phones and smartphones operate in frequency bands in the ultra-high frequency ("UHF") range, which the International Telecommunication Union ("ITU") defines as 300 MHz to 3 GHz.

In some embodiments of the present invention, the shield includes an additional compartment sized and configured to receive a portable charger for charging the portable device. The additional compartment can further include a portion sized and configured to receive one or more interchangeable power adapters to allow the shield to be used with different makes and models of device. These adapters are preferably formed so that when connected to a charger cord, the plug that engages the portable device is at a right angle to the cord.

In an aspect of the invention, a shield for a portable electronic device comprises a housing having an open-ended container element and a closure element. The container element is formed with an opening sized to allow passage of the device through the opening, and the closure element has respective engaged and disengaged positions relative to the container element for selective engagement with the container element. The shield further comprises first shielding material carried by the container element and second shielding material carried by the closure element. The first shielding material partially surrounds portions of the device that have been inserted through the opening in the container element.

When the closure element is in its engaged position, the container element and the closure element provide a compartment for the device, and the first shielding material and the second shielding material together substantially surround the device. This substantially prevents RF signals emitted by the device from leaving the shield, and further substantially prevents RF signals impinging on the shield from outside from reaching the device. When the closure element is in its disengaged position, the first shielding material and the second shielding material leave a gap. This allows RF signals emitted by the device to leave the shield, and further allows RF signals impinging on the shield from outside to reach the device.

The housing can further comprise an additional closure element having respective engaged and disengaged positions relative to the container element for selective engagement with the container element, and when the first-mentioned closure element is in its disengaged position, the additional closure element can be moved to its engaged position to prevent the device from falling out of the housing.

In a particular implementation, the container element and closure element are provided by a pouch with a folding flap, and the housing further comprises a rigid tray that includes a plate and an upstanding frame whose inner dimensions define the opening in the container element.

In another particular implementation, the housing comprises an additional open-ended container element formed with an opening sized to allow passage of a charger through the opening. The shield can be configured so that when the closure element is in its engaged position, the closure element also engages with the additional container portion so that the additional container portion and the closure element provide a compartment for the charger.

The additional container element can be provided by a pouch, and the housing can further comprise a charger tray sized for insertion in the pouch's opening wherein the charger tray includes a plate having a charger region and the plate is formed with one or more upstanding elements configured to keep the charger within the charger region. The charger tray's plate can also include at least one adapter-receiving region distinct from the charger region, and the charger tray's plate can be formed with one or more upstanding elements configured to keep a power cord adapter within the adapter-receiving region.

The shield can be constructed so that the first-mention container element and the additional container element are provided by a pouch having first and second openings, and the housing can further comprise a rigid device tray and a rigid charger tray. The device tray is sized for insertion in the pouch's first opening and includes a plate and an upstanding frame whose inner dimensions define the opening for the first-mentioned container element. The charger tray is sized for insertion in the pouch's second opening and includes a plate formed with one or more upstanding elements configured to constrain the charger.

In any of the embodiments discussed above, the first shielding material can be formed as a layer inside the first housing portion and include a portion that surrounds the opening in the first housing portion. The closure element can be formed as a flap that extends from the container portion, with the flap having a proximal portion formed adjacent the opening and a distal portion. In such a configuration, the engagement position is a folded position where the flap's proximal portion extends across the opening, and the second shielding material is formed on the flap's proximal portion. The non-engagement position is a folded position where the flap's proximal portion extends away from the opening so that the second shielding material is held away from the opening and does not contact the first shielding material.

In configurations having an additional open-ended container portion, the shield can further include a battery charging device held inside the additional container portion. In any of the embodiments discussed above, the first shielding material and/or the second shielding material can have at least a portion formed as a metallic (e.g., copper) mesh or as a metallized film or fabric.

In another aspect of the invention, a shield for a portable electronic device comprises a pouch, a rigid device tray, a rigid charger tray, first shielding material, and second shielding material. The pouch includes a set of outside walls that define an inner volume with an open end, an internal wall that divides the inner volume into first and second compartments and defines first and second openings at the pouch's open end, and a flap. The flap is connected to at least one of the outside walls, and is selectively movable between an open position that exposes the first and second openings and a closed position that closes the pouch.

The device tray is sized for insertion in the pouch's first opening and includes a plate and an upstanding frame whose inner dimensions are sized to accommodate the portable device. The charger tray is sized for insertion in the pouch's second opening and includes a plate having a charger region and at least one adapter-receiving region distinct from the charger region, one or more upstanding elements configured to accommodate a charger and to keep the charger within the charger region, and one or more upstanding elements configured to keep a power cord adapter within the adapter-receiving region.

The first shielding material is located inside the first compartment for partially surrounding the portable device when the portable device is inserted into the first compartment, and the second shielding is material mounted to the flap. When the flap is in its closed position, the first shielding material and the second shielding material together substantially surround the device, thereby substantially preventing RF signals emitted by the device from leaving the shield, and further substantially preventing RF signals impinging on the shield from outside from reaching the device. When the closure element is in its open position, the first shielding material and the second shielding material leave a gap, thereby allowing RF signals emitted by the device to leave the shield, and further allowing RF signals impinging on the shield from outside to reach the device.

A further understanding of the nature and advantages of the present invention may be realized by reference to the remaining portions of the specification and the drawings, which are intended to be exemplary and not limiting.

BRIEF DESCRIPTION OF THE DRAWINGS

FIGS. 1A, 1B, and 1C are high-level schematic side sectional views showing the basic configurations of a single-compartment radiation-blocking shield for holding a portable device in accordance with embodiments of the invention;

FIGS. 2A and 2B are high-level schematic side sectional views showing the basic configurations of a dual-compartment radiation-blocking shield with a main compartment for holding the portable device and an additional compartment for holding a portable charger;

FIG. 5A is a perspective view of a device tray that is inserted in the bottom compartment of the pouch of FIG. 4A to hold the portable device and to provide additional structure for the shield;

FIG. 5B is a front end view of the device tray of FIG. 5A (i.e., the end that remains nearest the open end of the pouch when the tray is fully inserted into the pouch);

FIGS. 5C and 5D are back end and top views of the device tray of FIG. 5A;

DESCRIPTION OF SPECIFIC EMBODIMENTS

Figure 3A:
FIGS. 3A, 3B, and 3C are schematic side sectional views showing how the closure elements for a shield such as that shown in FIGS. 1A, 1B, and 1C can be implemented as flaps/straps.

Overview: Single-Compartment Shield for Housing Portable Device (Schematic)

FIGS. 1A, 1B, and 1C are high-level schematic side sectional views showing configurations for a single-compartment shield 10 into which a portable electronic device 15 such as a smartphone can be inserted. In short, the shield is shown as including a first or main housing portion formed as an open-ended main container element 20 sized to accommodate a major portion or all of the portable device, and a second housing portion formed as one or more closure elements 25a and 25b. The first and second housing portions can be engaged to provide a single compartment (sometimes referred to as the "device compartment") for holding the portable device and allowing RF signals to be selectively blocked.

FIG. 1A shows the portable device only partially inserted into container element 20 and the two closure elements 25a and 25b separated from the container element, i.e., disengaged from the container element. The container element is formed with an opening 30 sized to allow passage of the device through the opening. In typical embodiments, the container element is a generally rectangular prism. In these views, the shield is considered to be lying horizontally so that the container element can be considered to have top and bottom walls 35a and 35b, and an end wall 40 at the left of the figures (with the opening at the right). The end with the opening is sometimes referred to as the front of the shield and the closed end as the back of the shield.

The one or more closure elements 25a and 25b are configured to close the opening so as to constrain the portable device. Put another way, the closure elements have respective engaged and disengaged positions relative to container element 20, i.e., are configured to selectively engage the container element.

In typical embodiments, main container element 20 is of a size to receive the entire portable device (i.e., the closed end and the open end are spaced by a distance that is longer than the length of the portable device), and the closure element or elements 25a and 25b making up the second housing portion are generally smaller than the container element.

One of the features of shield 10 is to provide electromagnetic shielding for the portable device, i.e., to substantially prevent electromagnetic radiation emitted by the device from leaving the shield, and to substantially prevent RF signals impinging on the shield from reaching the device. To that end, main container element 20 has (e.g., is lined with) shielding material 45, and one of the closure elements, say closure element 25a, is formed with additional shielding material 50. The container element's shielding material can be in the form of such materials as aluminized Mylar® film or metal (e.g., copper or silver) mesh. In a specific implementation, 100-mesh (100 openings per (linear) inch) square-weave mesh with copper wire of 0.0045 inch diameter is used. Such mesh products are readily available from vendors such as McNichols Company (www.mcnichols.com).

In this context, terms like "substantially prevent" and "prevent a significant portion" can be understood to mean blocking at least 75%, preferably at least 85%, and most preferably at least 95% of the radiation. For example, it is desired that the shield limit outgoing radiation to a SAR value on the order of 0.08 W/kg or less. Compared to the FCC-mandated limit of 1.6 W/kg, this represents an attenuation by a factor of 20 (i.e., blocking 95%).

The closure element's shielding material 50 is configured so that in the engaged position, the closure element's shielding material engages the container element's shielding material 45 so that the portable device is substantially fully surrounded and enclosed by shielding material. Thus the combined shielding material forms a Faraday cage and substantially prevents RF signals emitted by the device from leaving the shield, and further substantially prevents RF signals impinging on the shield from outside from reaching the device. Also shown is that closure element 25b is substantially devoid of shielding material. It is sometimes convenient to refer to the shielding-material-bearing closure element as the first closure element and the additional closure element as the second closure element.

FIG. 1B shows the shield in a configuration ("blocking mode") for shielding the portable device. In the blocking mode, the first closure element is engaged with the container element to shield the portable device while the second closure element need not be engaged, and is shown as disengaged from the container element. Since this is a high-level schematic view, the details of the mechanical and electrical engagement are shown schematically. Thus the first closure elements 25a is shown as generally abutted against the main container element 20, although the shielding material is shown as positioned just inside the container element's opening. The engaged container and closure elements provide the device compartment, which is denoted with reference numeral 55.

As will be discussed in detail below with respect to a specific embodiment, the closure element's shielding material is preferably 50 formed on a plate ("barrier plate") that snaps into the container element's opening (i.e., the plate's peripheral walls frictionally engage the inwardly facing walls of the opening in the container element. The same reference numeral 50 will be used to refer to the barrier plate. A suitable construction for the barrier plate is a plastic plate made of a material such as acrylonitrile butadiene styrene ("ABS") covered with metal (e.g., copper) mesh.

A separate ground connection 60 can be provided for the Faraday cage created by the mechanical and electrical engagement of the container element's shielding material 45 and the closure element's shielding material 50 (the barrier plate). This is shown schematically as a physical connection to the container element's shielding material 45, and that is also what is done in the specific embodiment discussed below. However, the ground connection could be made to the closure element's shielding material 50.

FIG. 1C shows the shield in a configuration ("normal-use mode") for allowing the portable device to communicate with the outside world. In the normal-use mode, first closure element 25a is disengaged from the container element and second closure element 25b is engaged with the container element. As shown in FIG. 1C, the first closure element's shielding material is sufficiently separated from the container element's shielding material so that electromagnetic radiation (including RF signals) emitted by the portable device can leave the shield, and RF signals directed toward the shield can reach the device.

The first and second closure elements are shown schematically as separate elements spaced apart from each other, and spaced apart from the container element when disengaged. This is for purposes of illustration only, illustrating how the first closure element can be engaged or disengaged from the container element to provide selective RF shielding. As will be discussed below, the functionality of the first and second closure elements are provided by one or more flaps and/or straps.

The closure elements are shown as having similar mechanical configurations, differing only in the absence or presence of shielding material. However, this is in general not necessary since the two are subject to different requirements. Each of the closure elements needs to engage the container element sufficiently to prevent the portable device from falling out. However, the first closure element needs to engage the container element so as to provide positive engagement of the respective elements' shielding materials. This may require a more positive engagement by the first closure element than by the second closure element.

Dual-Compartment Shield for Housing Portable Device and Charger (Schematic)

FIGS. 2A and 2B are high-level schematic side sectional views showing the basic operation of a dual-compartment radiation-blocking shield 10' that includes, in addition to device compartment 55 for holding the portable device, an auxiliary compartment 65 (referred to as the "charger compartment") sized to accommodate a portable charger 70 such as a solar charger or an auxiliary battery pack. To the extent that the portable charger is a solar charger, the charger compartment is formed with a transparent window 75 (e.g., formed from polycarbonate) to allow sunlight to reach the solar cells in the solar charger.

Also shown schematically in FIGS. 2A and 2B is a charger cord 80 connecting charger 70 at one end with device 15 at one end. In specific implementations, the cord can connect to the charger and the portable device at other locations, and the cord can traverse different paths. Since the cord has to penetrate the RF shielding at some location, consideration is given to minimizing the amount of signal leakage where the cord penetrates.

As schematically shown, the charger compartment has its own closure element 25c, which is in its engaged position. FIG. 2A shows the shield in the blocking mode where the portable device is shielded from RF radiation, while FIG. 2B shows the shield in the normal-use mode where the portable device is not shielded from RF radiation. To that extent, FIGS. 2A and 2B parallel FIGS. 1B and 1C.

Closure Elements Implemented as Flap and Strap

Figure 3B:
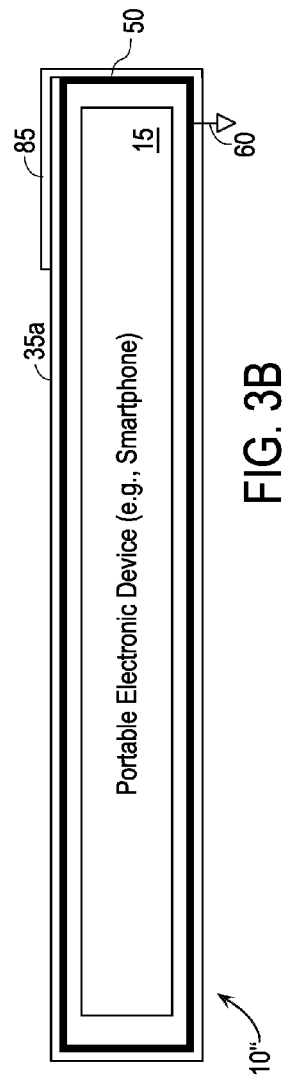
Figure 3C:
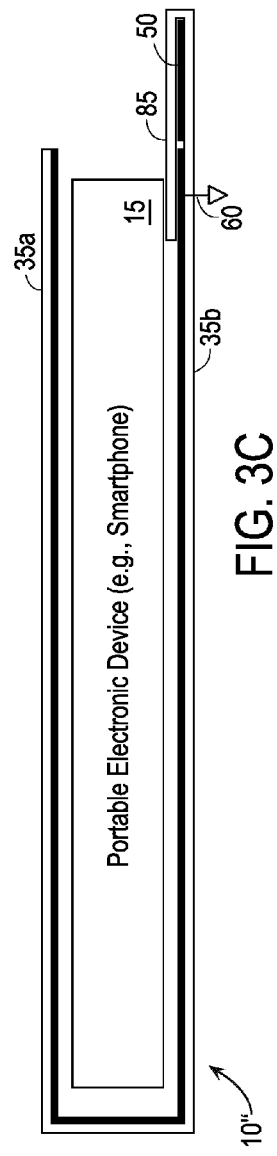
Figure 3D:
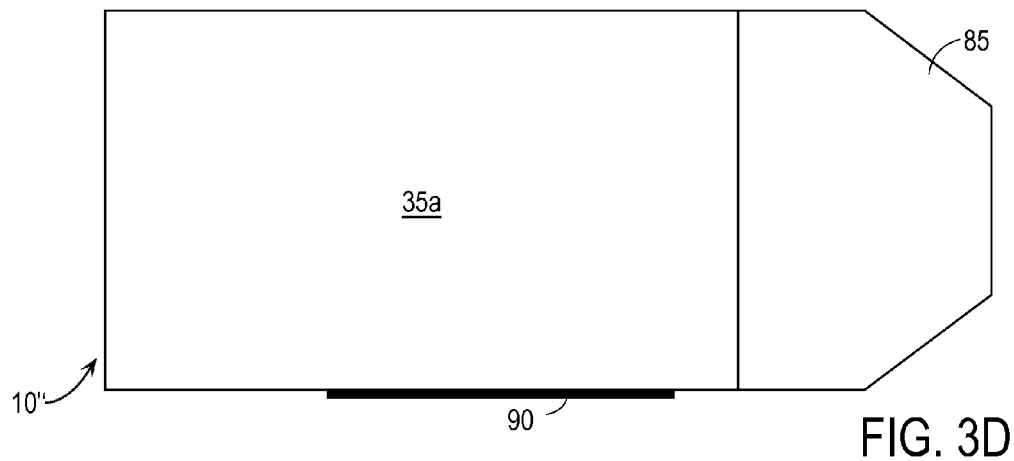
FIGS. 3D, 3E, and 3F are schematic top views corresponding to FIGS. 3A, 3B, and 3C, showing how the closure elements for a shield such as that shown in FIGS. 1A, 1B, and 1C can be implemented as flaps/straps.
Figure 3E:
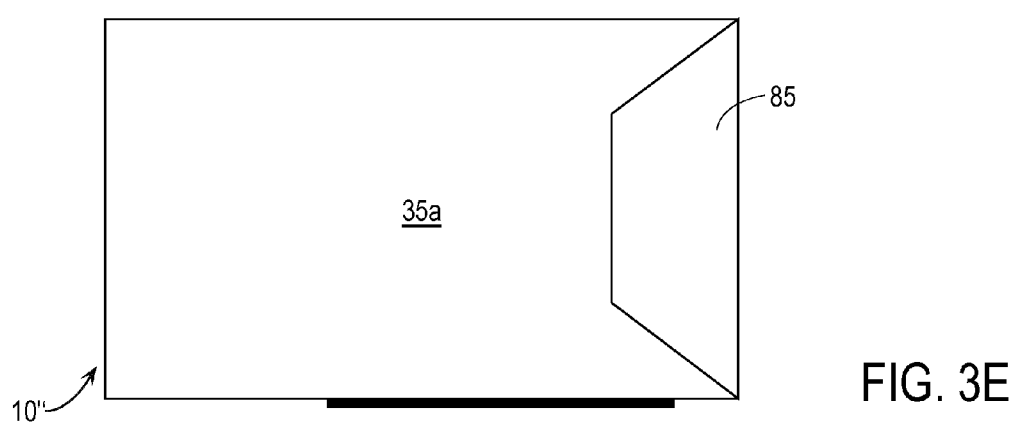
Figure 3F:
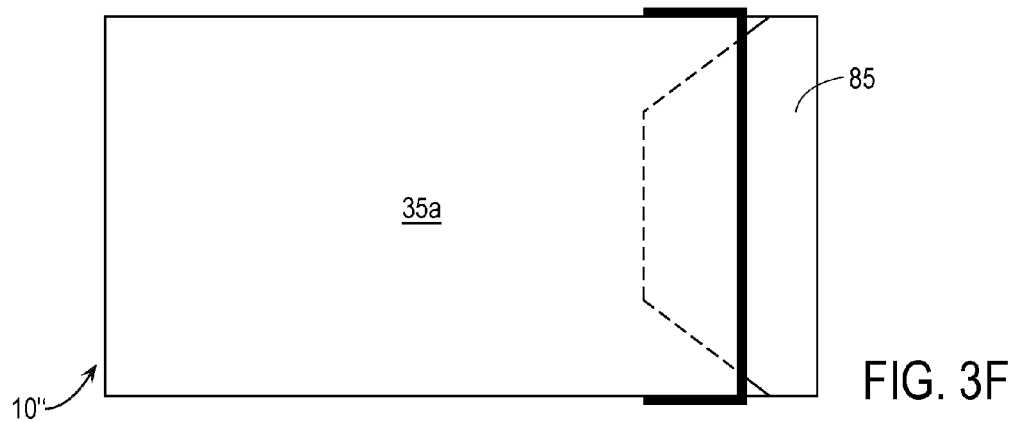

FIGS. 3A, 3B, and 3C are schematic side sectional views showing an embodiment of a shield 10" where the first closure element is implemented a flap 85 to which barrier plate 50 is fastened, and the second closure element is implemented as a strap 90 that closes, or at least partially closes the opening when the barrier plate is held away from the opening. For the particular embodiment, the strap is not shown in FIGS. 3A, 3B, or 3C, but FIGS. 3D, 3E, and 3F are schematic top views corresponding to FIGS. 3A, 3B, and 3C, and show the strap. The flap and/or strap can be held to the outside of the container element by any desired fastening mechanism. Examples include magnetic latches, hook-and-loop fasteners (e.g., Velcro® brand fasteners), snaps, buttons, zippers, and the like.

FIG. 3A shows shield 10" in a wide open configuration with the portable device fully inserted but the flap fully extended away from main container element 20. The flap (first closure element) extends away from a proximal end 95 nearest the the opening at the front of the shield, and terminates at a distal end 100. As can be seen, barrier plate 50 is fastened to the flap adjacent the proximal end of the flap so that it is close to the container element and to the container element's shielding material. A separate electrical connection between FIG. 3B shows shield 10" in a configuration for shielding the portable device (i.e., the blocking mode). The flap is shown as having been pulled around the opening and engaging top wall 35a of the container element. In this configuration, barrier plate 50 has been drawn into the opening so that it engages (i.e., makes contact with) the portions of the container element's shielding material that surround the opening. Therefore, the portable device is completely surrounded by shielding material, which provides RF shielding for the portable device.

FIG. 3C shows the shield in a configuration for allowing the portable device to communicate with the outside world (i.e., the normal-use mode). In this configuration, barrier plate 50 is held away from the opening so as to allow RF radiation emitted by the portable device to leave the shield, and RF radiation directed toward the shield to reach the device. The positioning of the barrier plate for this configuration is effected by having the flap folded tightly around the barrier plate and tucked under the portable device (i.e., between the portable device and the upper surface of bottom wall 35*b*.

FIG. 3D is a top view showing the shield in the wide open configuration of FIG. 3A with the portable device fully inserted but flap 85 (first closure element) fully extended away from the container element's opening and terminating at distal end 100. Strap 90 (second closure element) is shown as a thickened black line lying along a sidewall of the container element. As in the case of the flap, the strap is not really performing a closure function in this configuration.

FIG. 3E is a top view showing the shield in the blocking mode configuration of FIG. 3B, and as mentioned above, the flap has been pulled around the opening so as to engage top wall 35*a* of the container element. Again, the strap is not performing a closure function, since the flap is performing that function as well as holding the barrier plate's shielding material in proper engagement with the container element's shielding material.

FIG. 3F is a top view showing the shield in the normal-use mode configuration of FIG. 3C, and as mentioned above, the flap has been folded tightly around the barrier plate and tucked under the portable device. Strap 90 is shown as having been extended across the container element's opening and having been fastened to the opposite sidewall of the container element. The strap now provides the closure function by closing off a sufficient portion of the container element's opening to prevent the portable device from falling out. The strap can, but need not, be made of elastic material that stretches to extend around the container element's opening.

Specific Implementation

The following sections, described in connection with FIGS. 4A through 10C, illustrate components for a particular implementation of a dual-compartment shield. In this implementation, the shield comprises a pouch 105 and is fitted with rigid trays to be described below. To the extent reasonable, elements corresponding to those shown in the schematic views of FIGS. 1A through 3F will be denoted with the corresponding reference numerals.

Pouch

Figure 4A:
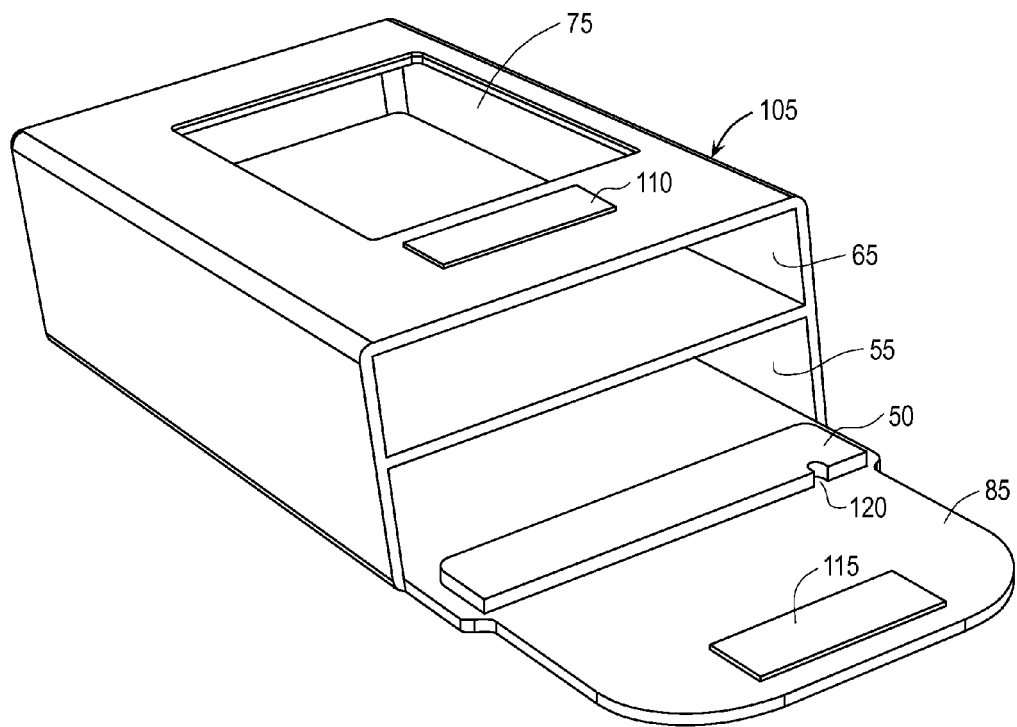
FIG. 4A is perspective view showing a representative construction of the pouch for a dual-compartment radiation-blocking shield (separate bottom and top compartments for holding the portable device and a portable charger) with the shield flap open.
Figure 4B:
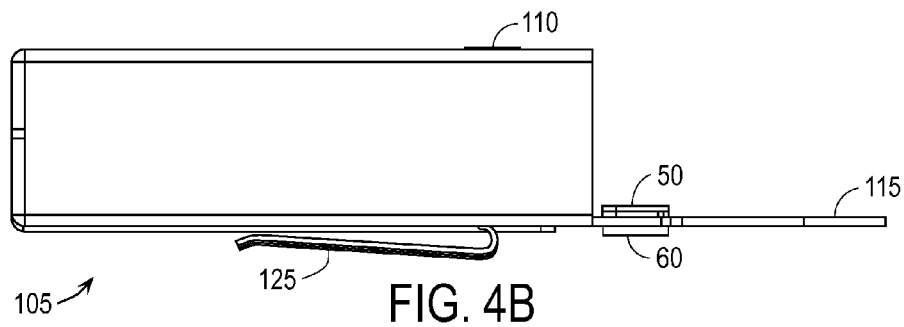
FIGS. 4B, 4C, and 4D are side, top, and bottom views of the pouch of FIG. 4A.
Figure 4C:
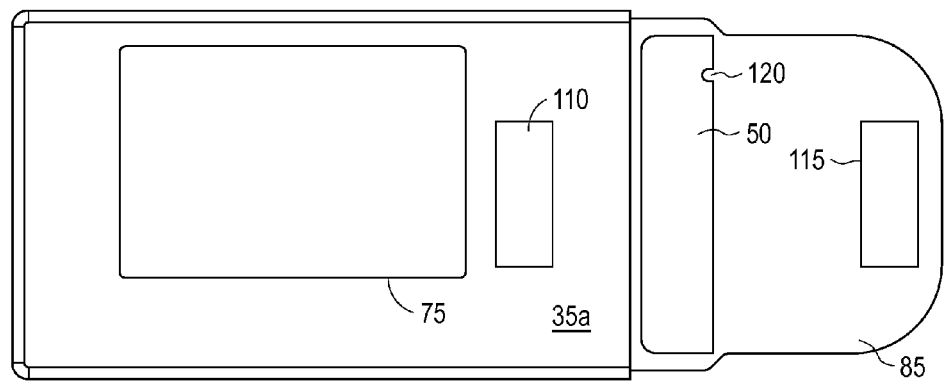
Figure 4D:
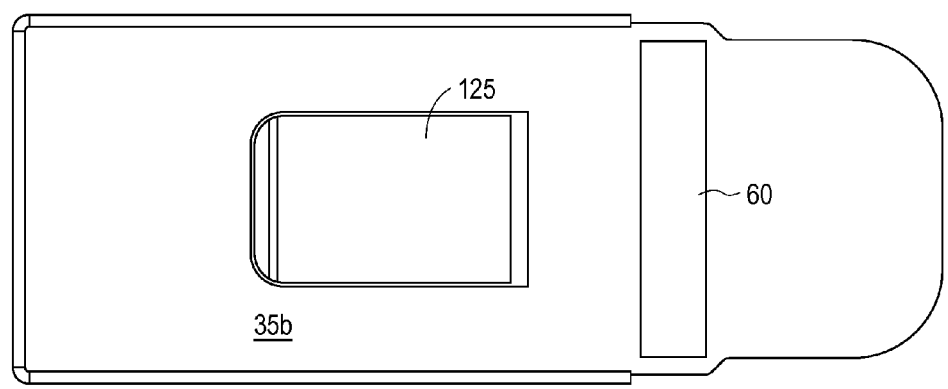
Figure 4E:
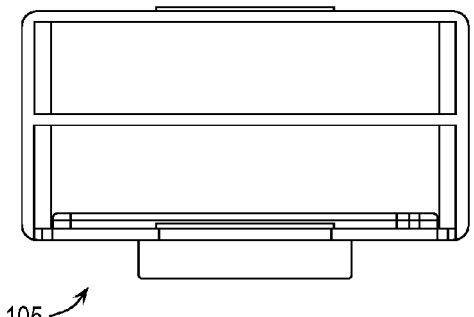
FIG. 4E is front end view of the pouch of FIG. 4A (i.e., from the open end that receives the portable device and the charger.
Figure 4F:
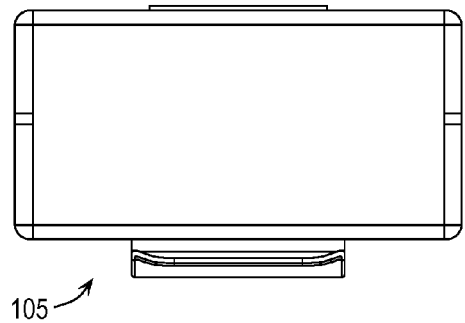
FIG. 4F is a back end view of the pouch of FIG. 4A (i.e., from the opposite, permanently closed, end)

FIG. 4A is perspective view showing a representative construction of pouch 105 for a dual-compartment radiation-blocking shield (separate bottom and top compartments 55 and 65 for holding the portable device and the portable charger) with flap 85 open. FIGS. 4B, 4C, and 4D are side, top, and bottom views of the pouch of FIG. 4A. FIG. 4E is an end view of the pouch of FIG. 4A from the open end that receives the portable device and the charger, while FIG. 4F is an end view of the pouch of FIG. 4A from the opposite (permanently closed end). Strap 90, shown in FIGS. 3C-3F, is not shown in these figures.

In the perspective view, the pouch is considered to be lying horizontally with the pouch flap open, and the visible horizontal surfaces that are shown as facing upwardly will be referred to as the upper surfaces. Similarly, the horizontal surfaces that are hidden in the perspective view may be referred to as the lower surfaces.

The pouch can be made of leather, vinyl or other plastic, fabric, or any other suitable sheet material for fabricating small cases, wallets, handbags and the like. Further, the pouch can be formed of one or more combinations and/or laminations of such materials. The particular materials are not part of the invention, and while flexible materials are generally contemplated, there is no fundamental reason that some or all of the pouch can be made of a largely rigid material. This could provide additional physical protection for the portable device, e.g., for the purpose of ruggedization in accordance with various industrial or military specifications (e.g., Mil-Spec standards, MIL-STD-810 F/G). As will be discussed below, while the bottom and top compartments 55 and 65 are generally for holding a portable electronic device and a charger, the shield preferably also includes generally rigid plastic trays (e.g., molded ABS plastic) that are inserted into the pouch compartments. These are referred to as the charger tray and the device tray.

As mentioned above, the top surface of pouch 105 is formed with transparent window 75 to allow the shield to be used with a solar charger. Located on the top surfaces of the pouch and flap are complementary fastening mechanisms 110 and 115 that hold the pouch closed when the flap is folded up and over the top surface. As mentioned above, such mechanisms can include any conventional fasteners such as magnetic latches, hook-and-loop fasteners (e.g., Velcro® brand fasteners), snaps, buttons, zippers, and the like.

Barrier plate 50 is disposed on the upper surface of the flap adjacent the open front end of the pouch. When the flap is folded over the shield, the barrier plate's edges will engage complementary facing surfaces at the opening in the device tray to provide a degree of electromagnetic shielding. As noted above, the barrier plate may be made of metal-covered plastic. Alternatively, the barrier plate may be made of other (possibly conductive) material that will block electromagnetic radiation. In a specific implementation, the barrier plate is made of ABS plastic with metal mesh bonded to the surface and edges. Further, the metal mesh preferably extends beyond the periphery of the plate and is bonded to the flap's upper surface As can be seen in the perspective and top views, the barrier plate is formed with a notch 120 to allow the barrier plate to snap into the device tray while allowing a power cord to pass from the charger to the portable device when the device is inside the shield in the blocking mode.

As can be seen most clearly in the side and bottom views, the pouch is provided with a belt clip 125 or similar element. Not seen in this view, but as described above, a strap can be fastened to one sidewall of the shield and be extended horizontally across the opening to selectively engage the opposite sidewall of the shield on the other side of the opening. In a particular embodiment, the strap is on the side of the pouch at the level of the lower compartment, to secure the handheld device in place. This can be an elastic fabric band that is stretched over the opening and engaged at the other side by means of a snap.

As mentioned above, a ground connection 60 for the Faraday cage inside the pouch can be provided to enhance the electromagnetic shielding. As can be seen in the perspective, side, and bottom views of FIGS. 4A, 4B, and 4D, flap 85 is preferably provided with a metallic ground element such as a metal (e.g., copper) ground plate commensurate in size with barrier plate 50 and mounted to the outside (lower surface) of the flap, with the flap being sandwiched between the ground plate and the barrier plate. Since the ground plate, when electrically connected to shielding material inside the pouch, can provide the separate ground connection, this plate is denoted with the reference numeral 60 to signify that it provides the separate ground connection mentioned above.

Barrier plate 50 and ground plate 60 can be held together by machine screws passing through the ground plate and flap and engaging threaded holes in the barrier plate. The plate surfaces contacting the flap could, in addition, or alternatively, be cemented to the flap. This can be implemented by electrically connecting the shielding-material sack to the metal plate by a separate grounding wire. The metal plate can also provide structural reinforcement for the barrier plate. The ground element could also be a metallized non-conducting plate.

Device Tray

FIG. 5A is a perspective view of the device tray 130, i.e., the tray that is inserted in the bottom compartment of the pouch of FIG. 4A to hold the portable device and to provide additional structure for the shield. Just as the pouch can be considered to have front and back ends, so can the device tray. The front end is shown generally on the right side of the figure and the back end is shown generally on the left side of the figure. FIG. 5B is a front end view of the device tray of FIG. 5A, FIG. 5C is a back end view of the device tray, and FIG. 5D is a top view of the device tray.

The device tray has a plate 135 commensurate with the inside of the pouch opening, and is preferably provided with an upstanding frame 140 at the front end of the plate, and a lip or flange 145 extending across the back edge of the plate. The inner dimensions of the frame are commensurate with the outer perimeter of the barrier plate to provide a snug press fit when the flap is pushed against the open front end of the shield. Although not shown in the figures, the top inside surface of the frame can be provided with a groove registered to the notch in the barrier plate.

The barrier plate is preferably of a stepped configuration (in effect two contacting parallel plates) with the larger plate's perimeter commensurate with the outside dimensions of the frame and the smaller plate's perimeter commensurate with the inside dimensions of the frame. Thus, the larger plate provides a stop when the smaller plate is snapped into the frame. Also, as mentioned above, the metal mesh preferably extends beyond the barrier plate and is bonded to the surrounding area of the pouch flap's upper surface.

Charger Tray

Figure 6A:
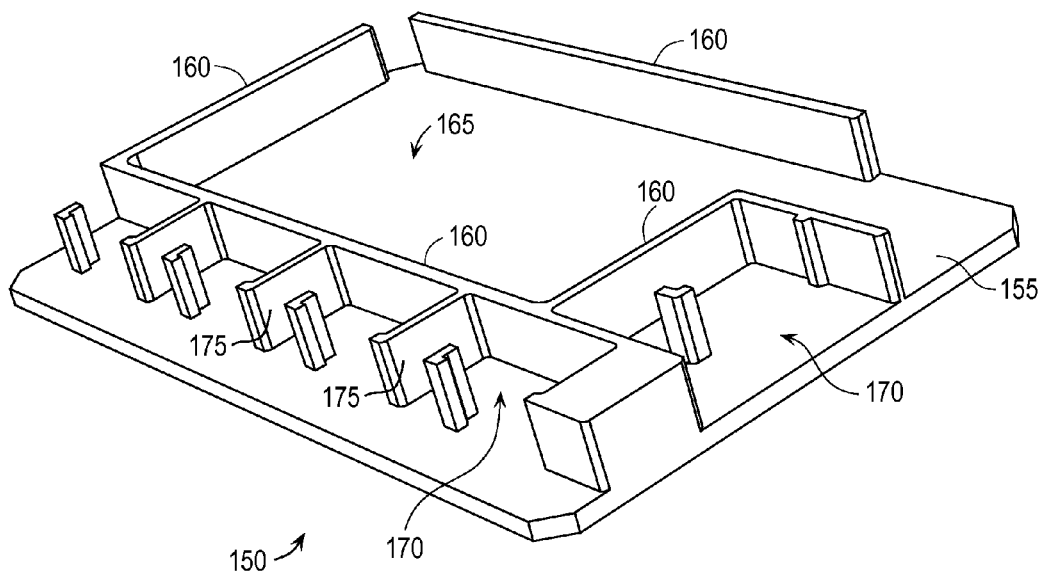
FIG. 6A is a perspective view of a charger tray that is inserted in the top compartment of the pouch of FIG. 4A to hold the charger and a number of adapters.
Figure 6B:
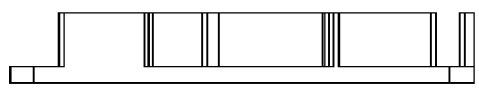
FIGS. 6B and 6C are front end and back end views of the charger tray of FIG. 6A.
Figure 6C:
Figure 6D:
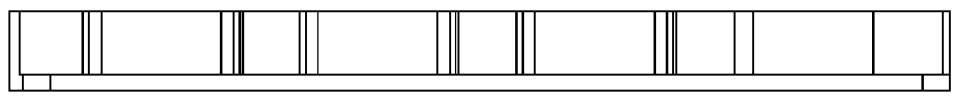
FIG. 6D is a side view of the charger tray of FIG. 6A from the side adjacent the row of adapter-receiving regions.
Figure 6E:
FIG. 6E is a side view of the charger tray of FIG. 6A from the side adjacent the major region that receives the adapter.
Figure 6F:
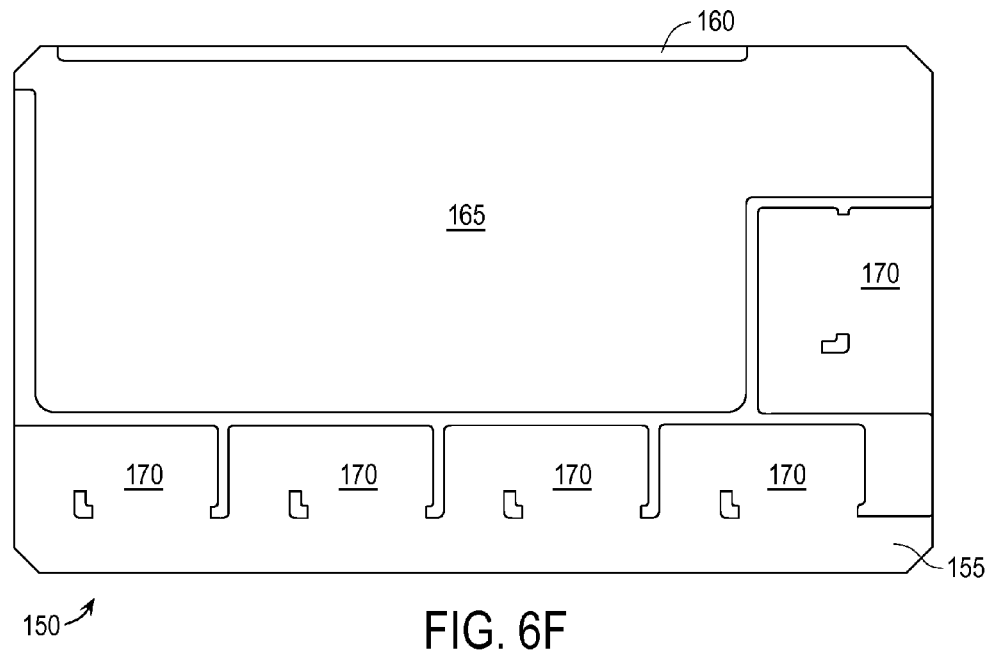
FIG. 6F is a top view of the charger tray of FIG. 6A.

FIG. 6A is a perspective view of the charger tray 150, i.e., the tray that is inserted in the top compartment of the pouch of FIG. 4A to hold the charger and a number of adapters. As can be seen, the charger tray includes a plate 155 that is subdivided by upstanding flanges 160 into a major region 165 and a number of peripheral adapter-receiving regions 170. As above, the front end is shown generally on the right side of the figure and the back end is shown generally on the left side of the figure. FIG. 6B is front end view of the charger tray of FIG. 6A, while FIG. 6C is a back end view of the charger tray. FIG. 6D is a side view of the charger tray from the side adjacent the row of adapter-receiving regions, while FIG. 6E is a side view of the charger tray from the side adjacent the major region that receives the charger. FIG. 6F is a top view of the charger tray.

As can be seen, major region 165 is sized for the portable charger, with upstanding peripheral flanges for constraining the charger's movement. The smaller adapter-receiving regions 170 are sized to receive and hold power adapters as will now be described in greater detail. The charger tray is preferably sized for a snug fit with the pouch's upper opening so that an auxiliary strap is not needed when the shield is in the normal-use mode (i.e., when the flap is folded under the portable device).

Different makes and models of portable devices typically have different connector sockets for charging. Put another way, the chargers for the different makes and models have different plugs at the end of the charger cord. Examples include mini-USB, micro-USB, as well as a number of proprietary connectors used by various vendors (e.g., Apple, LG, Nokia, Samsung, and Sony Ericsson).

At any given time, a portable device in the shield will have a particular connector socket for charging. However, in order to increase the versatility of the shield, it is preferred to provide adapters for different makes and models. This can be accomplished by providing a charger cord terminating in a universal connector (plug or socket) that mates with any of a set of adapters. Each adapter has two connectors, one compatible with the universal connector and the other compatible with the portable device.

The adapter-receiving regions 170 of the charger tray are preferably provided with protruding structures 175 and/or walls and/or detents to hold the adapters in place. In a particular embodiment shown, there are five such regions, four along one side and one at the end nearest the shield opening. It is contemplated, but by no means required, that the shield would be marketed with adapters for a number of common phones, stored in the adapter-receiving regions of the tray for shipping. Alternatively, phone vendors could customize the selection of adapters for the set of phones that they sell. A user of the shield would typically keep the adapter for the user's device on the charger cord in the shield and store the other adapters somewhere else to minimize the weight of shield in use.

Charger Cord and Adapters

Figure 7A:
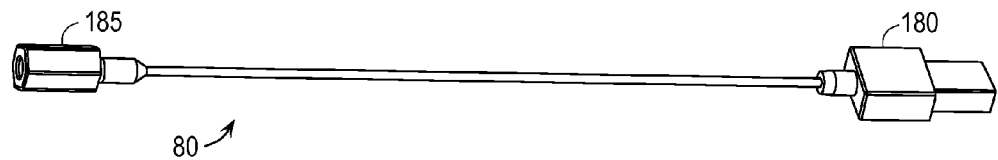
FIGS. 7A and 7B are perspective views of a representative charger cord for use with adapters in accordance with embodiments of the present invention.
Figure 7B:
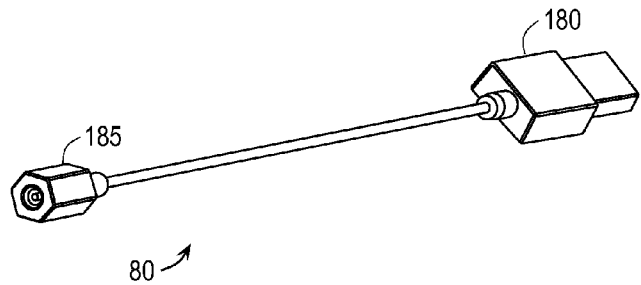

FIGS. 7A and 7B are perspective views of a representative example of charger cord 80 for use with adapters in accordance with embodiments of the present invention. As shown, the cord terminates at one end (right side of the figure) with a male USB (Standard-A) plug 180 that is used to plug into the charger module (not shown in these figures). The cord terminates at the other end with a universal connector 185 that is configured to mate with any of a set of adapters. In this implementation, the universal connector provides a female coaxial socket. The cord is preferably shielded. Although the invention is not limited by particular dimensions, a representative cord length is 7 inches.

Figure 8A:
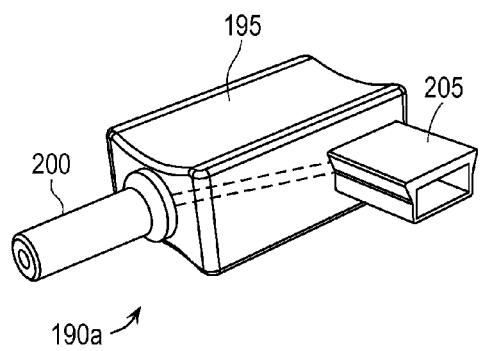
FIGS. 8A and 8B are perspective views of adapters providing different plugs.
Figure 8B:
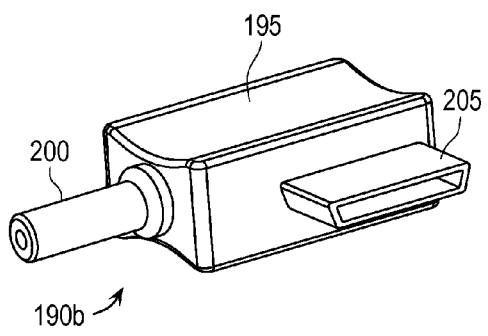

FIGS. 8A and 8B are perspective views of two different adapters 190a and 190b. Each comprises a housing 195, a charger-side connector 200 that mates with the charger cord, and a device-side connector 205 for mating with the portable device. Since the charger cord shown above provides a female coaxial socket, the charger-side connector is a coaxial male connector complementary with connector 185 on the cord. Any complementary connector system could be used. Each adapter has its own particular connector for mating with a particular connector on a portable device. As shown, adapter 190a in FIG. 8A is provided with a mini-USB (Mini-B) plug as its device-side connector while adapter 190b in FIG. 8B is provided with a micro-USB (Micro-B) plug as its device-side connector. For compactness, as shown in the figure, housing 195 holds the adapter's charger-side connector (plug or socket) and device-side connector (typically plug) at a right angle to facilitate charging of the device when it is in the shield's main compartment. Electrical connections between charger-side connector 200 and device-side connector 205, located in the housing, are shown schematically as dashed lines.

Figure 9:
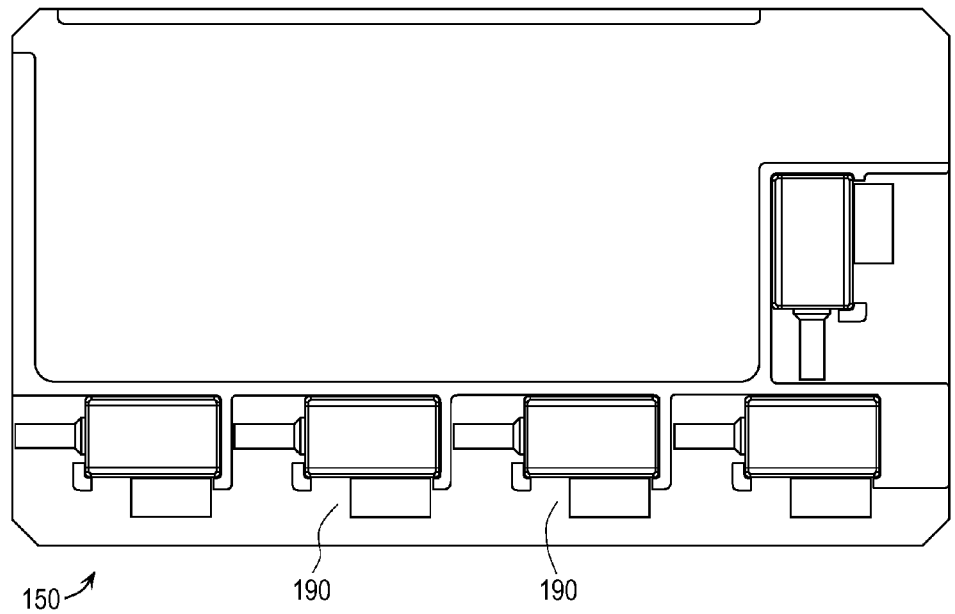
FIG. 9 is a top view of the charger tray of FIG. 6A with a number of adapters stored therein.

FIG. 9 is a top view of the charger tray 150 of FIG. 6A with a number of adapters 190 stored therein. For illustrative purposes only, all the adapters are like the adapter of FIG. 8B; however, it would normally be the case that the adapters would be different from each other.

Figure 10A:
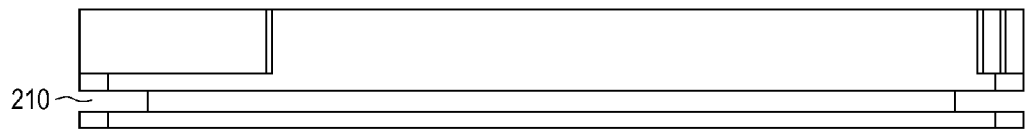
FIG. 10A is a side view of a charger tray (shown from the same side as the tray in FIG. 6E) where the bottom portion of the tray is provided with a peripheral channel for accommodating a charger cord.

FIG. 10A is a side view of an embodiment of a charger tray 150' where the bottom portion of the tray (the plate portion) is provided with a peripheral channel 210 for accommodating a charger cord. This view is shown from the side adjacent the tray's major region that receives the adapter (i.e., the view corresponding to FIG. 6E). Although the charger cord described above has a length on the order of 7 inches so that it can run from the charger to the portable device without significant excess length, there may be instances, such as that described below, where a longer charger cord is used. Peripheral channel 210 can be provided by making plate 155 sufficiently thick so that the channel can be formed (molded) as a groove in the plates outside walls. Alternatively, the channel can be provided by a second plate spaced from plate 155 by appropriate posts or other spacers.

Figure 10B:
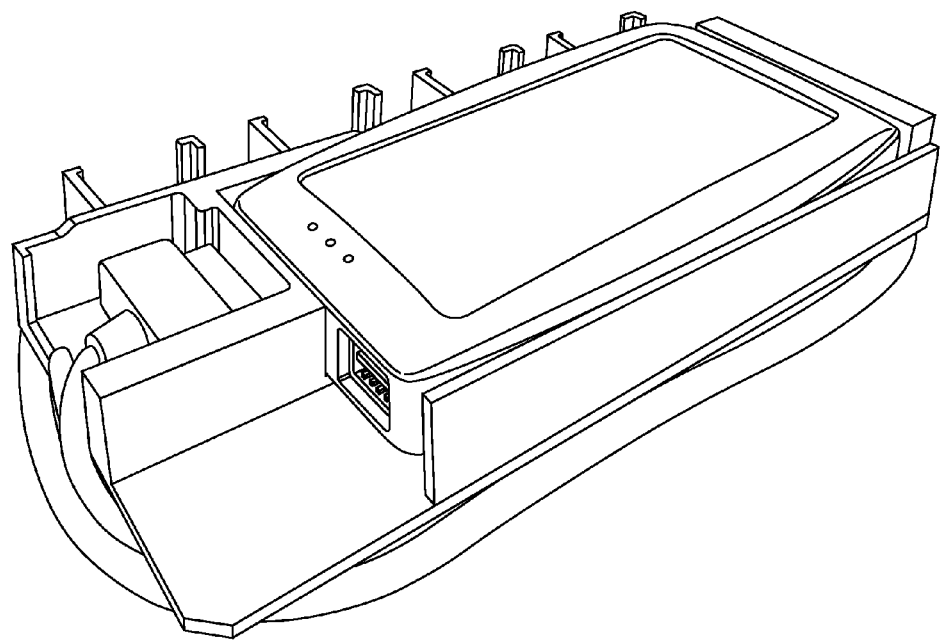
FIGS. 10B and 10C are top and bottom perspective views of the charger tray of FIG. 10A, but also showing a charger and cord.
Figure 10C:
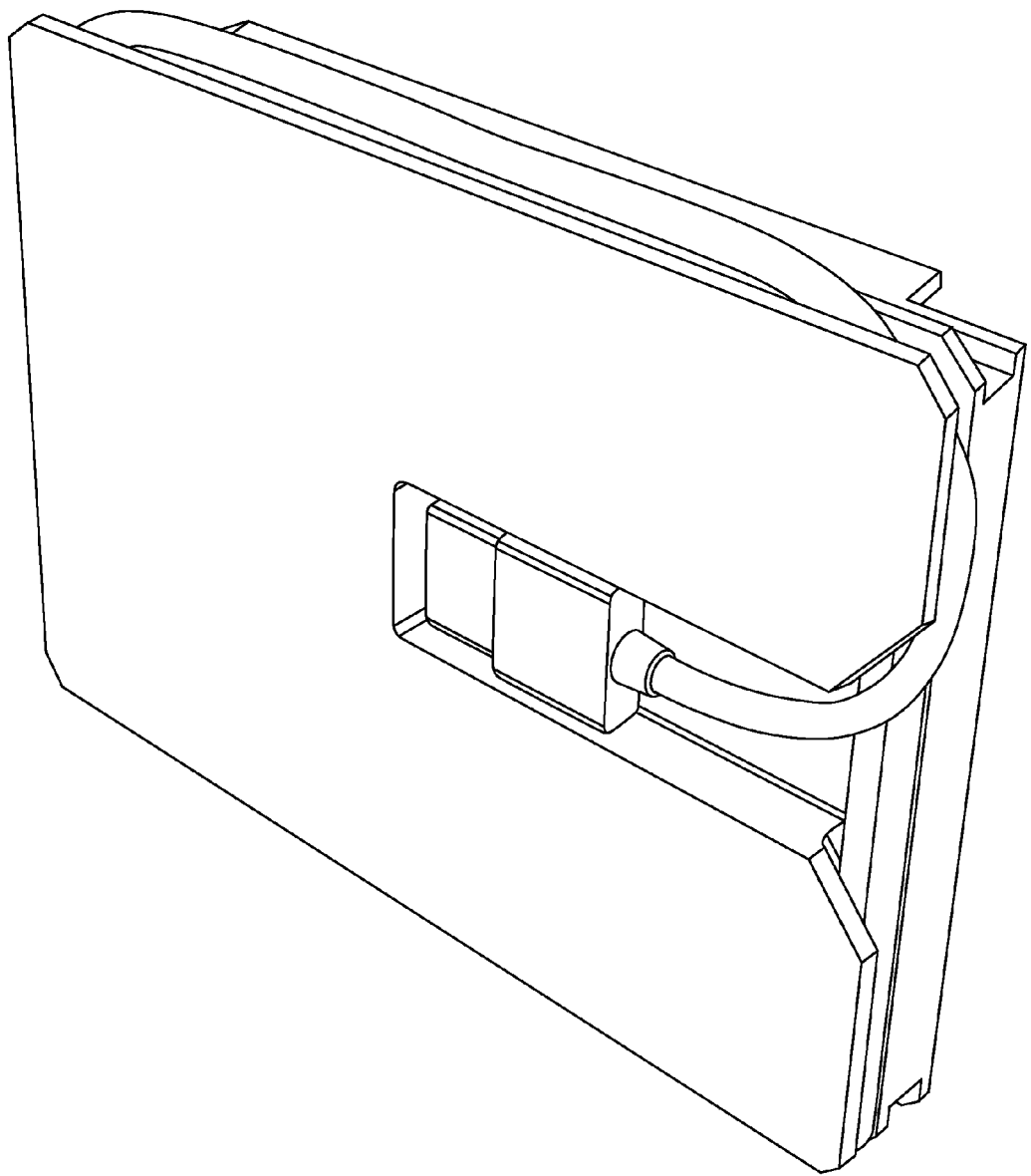

FIGS. 10B and 10C are top and bottom perspective views of this charger tray, but also showing a charger (top perspective view) and a cable in channel 210 (both perspective views). The top perspective view shows a particular solar charger with a Standard-A USB socket to supply power to the portable device while the bottom perspective view shows the end of the cord fitted with a Standard-A USB plug. Not shown in these views is the fact that the charger itself can be charged from an external power source, and is provided with a suitable (e.g., micro-USB or mini-USB) socket used for this purpose.

In this embodiment, the front adapter-receiving region is configured to accommodate a specific manufacturer's connector at the end of a cord provided by the manufacturer. In the specific case, the cord is for an Apple iPhone®, and can be 3 feet long. The top perspective view shows the end of the cord with the proprietary 30-pin connector while the bottom perspective view shows the end of the cord with a standard male USB plug.

As mentioned above, the charger tray has a peripheral channel to accommodate the cord, which is shown wrapped around the tray. Although specific dimensions are not required, in this specific embodiment, the channel is on the order of ½ cm deep and ½ cm wide. The bottom surface of the charger tray is formed with a slot 215 that accommodates the USB plug so that the USB plug can be flush with the bottom surface. The slot can be on the order of 7 cm long and 1½ cm wide.

Metallic Shielding Elements

As mentioned above, device compartment 55 of the pouch is preferably lined with material 45, which can be metallic (e.g., silver or copper) mesh. This can be accomplished in a variety of ways. A specific implementation has the shielding material formed into a sack-like configuration and bonded to the device tray. This has the advantage that the shielding material can be removed from the pouch, for example in the event that the shielding material is compromised and needs to be repaired.

One approach for is to have device tray 130 inside the shielding-material sack, and to bond the inside surfaces of the shielding-material sack to the device tray. Suitable bonding sites include the bottom and side surfaces of the tray, the outer surface of flange 145 along the back end of the device tray, and the outer surfaces of frame 140 (including the front surfaces immediately adjacent to the opening).

Another approach is to bond the outer surfaces of the shielding-material sack to the device tray. Suitable bonding sites include the top surface of the device tray, the front facing surface of flange 145 along the back end of the device tray, and the inwardly facing surfaces of frame 140 at the front of the device tray.

Both these approaches could be used simultaneously by providing two shielding-material sacks. These would include an outer sack with its inner surfaces bonded to the tray, and an inner sack with its outer surfaces bonded to the tray, typically using the bonding sites described above. In either event, a ground wire can be electrically connected (e.g., by soldering) to the metal mesh and connected to ground plate 60. Alternatively, or in addition, the ground plate could be electrically connected to the metal mesh on the barrier plate.

A non-abrasive liner (e.g., microfiber cloth or artifical leather) is preferably provided as the innermost material within the device compartment, i.e., inside the shielding-material, to protect the device as it is inserted into and withdrawn from the shield. The non-abrasive liner could be deployed as sheet material, or could be deployed as a coating. The deployment of the non-abrasive liner material would typically depend in part on the manner in which the shielding material is deployed.

In a specific embodiment, the material is a microporous polymeric imitation leather. In an embodiment where the shielding material is deployed outside the plastic device tray, the liner material can be bonded directly to the plastic surface of the tray. In a specific embodiment, the liner material is bonded to the inner surface of the frame, with its edge about ½ cm in from the front edge of the frame.

If the shielding material includes a shielding-material sack with its outside surfaces bonded to the device tray, the liner material could be a sheet material such as a sack that is bonded to the inside surfaces of the shielding-material sack, or the liner material could be a coating on the inside surfaces of the shielding-material sack. If the shielding material only includes a sack outside tray, the liner material could be deployed as a sack with its outside surfaces bonded to the device tray along the lines described above for bonding a shielding-material sack's outer surfaces to the device tray.

Representative Dimensions

While specific dimensions are not required for embodiments of the present invention to provide useful functionality, examples will be given. The dimensions are derived in part from dimensions of typical smartphone devices, and also can reflect some preferred construction features. The dimensions are to be considered exemplary rather than limiting, it being realized that the dimensions of some elements are constrained by the dimensions of others.

For example, a representative dual-compartment pouch suitable for the most common smartphones can have outer dimensions on the order of 1.5-2.2 inches high, 3.1-3.7 inches wide, and 5.5-6.2 inches long. As mentioned above, the device and charger trays are configured for a snug fit in their respective compartments, which means that their width and length would be slightly smaller than the outer width and length of the pouch. Different sizes might be appropriate based on different case configurations to accommodate larger portable electronic devices.

Use Scenarios

Use scenarios include: a) charging the (solar) charger; b) connecting the portable electronic device to the (solar) charger; c) using the shield in the blocking mode; d) using the shield in the normal-use mode; and e) wearing the shield.

As mentioned above, the charger can be provided with a mini-USB socket for charging. The user can charge the charger by connecting the mini-USB adapter to the female (socket) end of the universal power cord, plugging the mini-USB plug into the charger's receptacle, and plugging the standard USB end of the power cord to a computer's USB socket or to a USB connected power source (e.g., one that connects to a wall outlet or a car's lighter/accessory outlet).

The user can connect the charger, so charged, to the portable device by first connecting the appropriate (right-angle) adapter from the adapter tray to the female end of the universal power cord and plugging the standard USB end of the power cord into the charger. The user can then connect the adapter plug (e.g., mini-USB) into the portable device's charging socket. The portable device can then be inserted into the pouch.

For the blocking mode, the user can align the power cord with the notch in the barrier plate so that the barrier plate can be pressed into place by pressing on the copper plate that is on the outside of the flap (lower surface in FIG. 4A). This completes the RF/electromagnetic shield.

For the normal-use mode, the user can fold the flap over the barrier plate and tuck the flap between the bottom surface of the device tray and the bottom wall of the pouch so that the barrier plate then extended in the plane of the lower surface of the pouch and away from the opening. This would then allow RF signals to be sent from and received by the portable device. The user would then pull the auxiliary strap across the opening to prevent the portable device from falling out of the pouch.

In either mode, it has been found convenient and comfortable to wear the shield on the hip and at a horizontal angle or a 45-degree angle, although that is clearly a matter of user preference. The user is also free to ignore the belt clip and carry the shield around in any other desired way.

CONCLUSION

In conclusion, it can be seen that embodiments of the present invention can provide an elegant and effective solution to what some see as deleterious effects of exposure to electromagnetic radiation, loss of security and/or privacy, and distracted driving. Depending on circumstances, the user might enjoy one or more of these possible benefits.

While the above is a complete description of specific embodiments of the invention, the above description should not be taken as limiting the scope of the invention as defined by the claims.

What is claimed is:

1. A shield for a portable electronic device comprising:
   a housing having
      an open-ended container element formed with an opening sized to allow passage of the device through the opening,
      a closure element having respective engaged and disengaged positions relative to the container element for selective engagement with the container element; and
      a rigid tray that includes
         a plate extending in a first plane, and
         an upstanding U-shaped frame having first and second side elements that extend upwardly away from the plate, and a top element that extends between the side elements and lies in a second plane that is parallel to the first plane, wherein the spacing between the side elements and the spacing between the plate and the top element define the opening in the container element through which the portable device is inserted along a direction parallel to the first plane,
   first shielding material carried by the container element wherein the first shielding material partially surrounds portions of the device that have been inserted through the opening in the container element; and
   second shielding material carried by the closure element;
   wherein when the closure element is in its engaged position:
      the container element and the closure element provide a compartment for the device;
      the first shielding material and the second shielding material together substantially surround the device and form a Faraday cage, thereby substantially preventing RF signals emitted by the device from leaving the shield, and further substantially preventing RF signals impinging on the shield from outside from reaching the device; and
   wherein when the closure element is in its disengaged position, the first shielding material and the second shielding material leave a gap, thereby allowing RF signals emitted by the device to leave the shield, and further allowing RF signals impinging on the shield from outside to reach the device.

2. The shield of claim 1, and further comprising a ground connection for the first and second shielding material.

3. The shield of claim 1, and further comprising:
   a metallic plate mounted to the outside of the housing; and
   an electrical conductor connecting the metallic element to at least one of the first and second shielding material.

4. The shield of claim 1 wherein:
   the housing comprises an additional closure element having respective engaged and disengaged positions relative to the container element for selective engagement with the container element; and
   when the first-mentioned closure element is in its disengaged position, the additional closure element can be moved to its engaged position to prevent the device from falling out of the housing.

5. The shield of claim 1 wherein:
   the first shielding material is formed as a layer inside the first housing portion and includes a portion that surrounds the opening in the first housing portion;
   the closure element is formed as a flap that extends from the container portion, the flap having a proximal portion formed adjacent the opening and a distal portion;
   the engagement position is a folded position where the flap's proximal portion extends across the opening; and
   the second shielding material is formed on the flap's proximal portion.

6. The shield of claim 5 wherein:
   the non-engagement position is a folded position where the flap's proximal portion extends away from the opening so that the second shielding material is held away from the opening and does not contact the first shielding material.

7. The shield of claim 1, and further comprising:
   an additional open-ended container portion adjacent the first-mentioned container portion;
   a battery charging device held inside the additional container portion wherein the additional open-ended container element is formed outside the Faraday cage.

8. The shield of claim 1 wherein the first shielding material has at least a portion formed of a metallic mesh, a metallized film, or a metallized fabric.

9. The shield of claim 1 wherein the second shielding material has at least a portion formed of a metallic mesh, a metallized film, or a metallized fabric.

10. The shield of claim 1 wherein the shield is a dual-compartment shield with a first compartment that includes the Faraday cage, and an adjacent second compartment that is sized to accommodate an auxiliary charger for the device wherein the second compartment is formed outside the Faraday cage.

11. A shield for a portable electronic device comprising:
    a pouch having
       a first open-ended container element formed with a first opening sized to allow passage of the device through the first opening, a second open-ended container element formed with a
second opening sized to allow passage of a charger
through the second opening,
a charger tray sized for insertion in the second opening,
wherein:
the charger tray includes a plate having a charger
region, and
the charger tray's plate is formed with one or more
upstanding elements configured to keep the charger
within the charger region;
a flap having respective engaged and disengaged positions relative to the first and second container elements for selective engagement with the first and second container elements;
first shielding material carried by the first container element wherein the first shielding material partially surrounds portions of the device that have been inserted through the opening in the container element; and
second shielding material carried by the flap;
wherein when the flap is in its engaged position:
the first container element and the flap provide a compartment for the device;
the flap also engages with the second container element so that the second container element and the flap provide a compartment for the charger;
the first shielding material and the second shielding material together substantially surround the device and form a Faraday cage, thereby substantially preventing RF signals emitted by the device from leaving the shield, and further substantially preventing RF signals impinging on the shield from outside from reaching the device;
the second container element is adjacent the first container element and outside the Faraday cage; and
wherein when the flap is in its disengaged position:
the first shielding material and the second shielding material leave a gap, thereby allowing RF signals emitted by the device to leave the shield, and further allowing RF signals impinging on the shield from outside to reach the device.

12. The shield of claim 11 wherein:
the charger tray's plate includes at least one adapter-receiving region distinct from the charger region; and
the charger tray's plate is formed with one or more upstanding elements configured to keep a power cord adapter within the adapter-receiving region.

13. A shield for a portable electronic device comprising:
a housing having:
a first open-ended container element formed with a first opening sized to allow passage of the device through the first opening, and
a rigid device tray sized for insertion in the first opening wherein the device tray includes a plate and an upstanding frame whose inner dimensions define the opening for the first container element,
a second open-ended container element formed with a second opening sized to allow passage of a charger through the second opening,
a rigid charger tray sized for insertion in the second opening wherein the charger tray includes a plate formed with one or more upstanding elements configured to constrain the charger, and
a closure element having respective engaged and disengaged positions relative to the first container element for selective engagement with the first container element;
first shielding material carried by the first container element wherein the first shielding material partially surrounds portions of the device that have been inserted through the first opening; and
second shielding material carried by the closure element;
wherein when the closure element is in its engaged position:
the container element and the closure element provide a compartment for the device, and
the first shielding material and the second shielding material together substantially surround the device, thereby substantially preventing RF signals emitted by the device from leaving the shield, and further substantially preventing RF signals impinging on the shield from outside from reaching the device; and
wherein when the closure element is in its disengaged position, the first shielding material and the second shielding material leave a gap, thereby allowing RF signals emitted by the device to leave the shield, and further allowing RF signals impinging on the shield from outside to reach the device.

14. A shield for a portable electronic device comprising:
a pouch that includes,
a set of outside walls that define an inner volume with an open end,
an internal wall that divides the inner volume into first and second compartments and defines first and second openings at the pouch's open end, and
a flap connected to at least one of the outside walls, the flap being selectively movable between an open position that exposes the first and second openings and a closed position that closes the pouch;
a rigid device tray sized for insertion in the pouch's first opening wherein the device tray includes,
a plate, and
an upstanding frame whose inner dimensions are sized to accommodate the portable device;
a rigid charger tray sized for insertion in the pouch's second opening wherein the charger tray includes
a plate having a charger region and at least one adapter-receiving region distinct from the charger region,
one or more upstanding elements configured to accommodate a charger and to keep the charger within the charger region, and
one or more upstanding elements configured to keep a power cord adapter within the adapter-receiving region;
first shielding material located inside the first compartment for partially surrounding the portable device when the portable device is inserted into the first compartment; and
second shielding material mounted to the flap;
wherein when the flap is in its closed position,
the first shielding material and the second shielding material together substantially surround the device, thereby substantially preventing RF signals emitted by the device from leaving the shield, and further substantially preventing RF signals impinging on the shield from outside from reaching the device; and
wherein when the flap is in its open position,
the first shielding material and the second shielding material leave a gap, thereby allowing RF signals emitted by the device to leave the shield, and further allowing RF signals impinging on the shield from outside to reach the device.

15. The shield of claim 14, and further comprising:
a metallic element mounted to the pouch and disposed outside the pouch when the flap is in its closed position; and
an electrical connector between the metallic element and either or both of the first shielding material and the second shielding material.

16. A shield for a portable electronic device comprising:
a pouch that includes,
- a set of walls that define a device container element with an open end, the device container element having an inner volume sized to accommodate the portable device, and
- a flap connected to at least one of the walls, the flap being selectively movable between an open position that exposes the device container element's open end and a closed position that closes the device container element's open end;

a first rigid structure positioned in the device container element's open end, the first rigid structure having an opening with inner dimensions sized to allow the portable device to pass through the opening into the pouch;
first shielding material that
- is located inside the device container element for partially surrounding the portable device when the portable device is inserted into the device container element, and
- has a portion adjacent the first rigid structure's opening, the portion being supported by the first rigid structure and surrounding the first rigid structure's opening;

a second rigid structure mounted to the flap and having a protruding portion that is sized complementarily with respect to the first rigid structure's opening; and
second shielding material mounted to the flap and surrounding the protruding portion of the second rigid structure;
wherein when the flap is in its closed position,
- the second rigid structure's protruding portion is positioned within the first rigid structure's opening and cooperates with the first rigid structure to hold the first shielding material and the second shielding material in electrical and mechanical engagement with each other so that the first shielding material and the second shielding material together substantially surround the device, thereby substantially preventing RF signals emitted by the device from leaving the shield, and further substantially preventing RF signals impinging on the shield from outside from reaching the device; and wherein when the flap is in its open position,
- the first shielding material and the second shielding material leave a gap, thereby allowing RF signals emitted by the device to leave the shield, and further allowing RF signals impinging on the shield from outside to reach the device.

17. The shield of claim 16 wherein the pouch includes additional walls that define a charger container element with an open end and an inner volume sized to accommodate a portable charger.

* * * * *